United States Patent
Choi

(10) Patent No.: US 7,136,407 B2
(45) Date of Patent: Nov. 14, 2006

(54) SEMICONDUCTOR LASER DIODE WITH REMOVABLE HIGH REFLECTION FILM AND METHOD OF MANUFACTURING THE SAME

(75) Inventor: Kwang-ki Choi, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/984,854

(22) Filed: Nov. 10, 2004

(65) Prior Publication Data

US 2005/0151150 A1 Jul. 14, 2005

(30) Foreign Application Priority Data

Nov. 11, 2003 (KR) .................. 10-2003-0079598

(51) Int. Cl.
*H01S 5/00* (2006.01)
(52) U.S. Cl. .................. 372/49.01; 372/39; 372/43.01; 372/44.01
(58) Field of Classification Search .................. None
See application file for complete search history.

(56) References Cited

U.S. PATENT DOCUMENTS 6,647,047 B1 * 11/2003 Yokota
6,720,582 B1 * 4/2004 Miyokawa et al.
2004/0233956 A1 * 11/2004 Sano

OTHER PUBLICATIONS

"CRC Handbook of Chemistry and Physics," ed. David Lide, 2000, CRC Press, 81st edition, p. 12-197 to 12-198.*

* cited by examiner

*Primary Examiner*—Nathan J. Flynn
*Assistant Examiner*—Kevin Quinto
(74) *Attorney, Agent, or Firm*—Buchanan Ingersoll & Rooney PC

(57) ABSTRACT

Provided are a semiconductor laser diode and a method of manufacturing the same. The semiconductor laser diode includes an n-type compound semiconductor layer; a resonant layer stacked on a predetermined region of the n-type compound semiconductor layer; a p-type compound semiconductor layer formed on the resonant layer; electrodes respectively formed on each of the p-type and n-type compound semiconductor layers; a bonding metal film stacked on the electrodes; and a high reflection film stacked on the other surface of the resonant layer facing a surface through which a laser generated from the resonant layer is emitted, wherein the thickness of the bonding metal film is greater than that of the high reflection film.

13 Claims, 5 Drawing Sheets

(2 of 5 Drawing Sheet(s) Filed in Color)

SEMICONDUCTOR LASER DIODE WITH REMOVABLE HIGH REFLECTION FILM AND METHOD OF MANUFACTURING THE SAME

BACKGROUND OF THE INVENTION

This application claims the priority of Korean Patent Application No. 2003-79598, filed on Nov. 11, 2003, in the Korean Intellectual Property Office, the disclosure of which is incorporated herein in its entirety by reference.

1. Field of the Invention

The present invention relates to a light emitting device and a method of manufacturing the same, and more particularly, to a semiconductor laser diode and a method of manufacturing the same.

2. Description of the Related Art

In a conventional method of manufacturing a semiconductor laser diode on a wafer, bonding metal films are deposited on a p-type electrode and an n-type electrode. To obtain a laser emission from a selected surface of the completed semiconductor laser diode, a high reflection film is deposited on the other surface through which the laser can be emitted. At this time, the high reflection film is also deposited on the bonding metal films stacked on the p-type and n-type electrodes. When the high reflection film is deposited on the bonding metal film, heat generated from the semiconductor laser diode during operation cannot be rapidly dissipated, and it also interferes with flip-chip bonding. Therefore, after forming a high reflection film on the bonding metal film, the high reflection film is removed using a reactive ion-beam etching.

However, a portion of the high reflection film formed on the bonding metal film remains in an un-bonded state on the bonding metal film because of a weak adhesive force between the bonding metal film and the high reflection film.

FIG. 1 shows this result. Reference numeral 10 in FIG. 1 indicates the bonding metal film from which the high reflection film is removed by the reactive ion-beam etching. Reference numeral 20 indicates the high reflection film remained on the bonding metal film 10 after the reactive ion-beam etching.

In the case of a conventional semiconductor laser diode (hereinafter, conventional laser diode), since a portion of the high reflection film remains on the bonding metal film after reactive ion-beam etching for removing the high reflection film stacked on the bonding metal film, heat dissipation from the conventional laser diode is remarkably reduced. Also, a bonding force in flip-chip bonding can be weakened or, in the worst case, bonding can not be formed.

Therefore, there have been an attempts to remove the high reflection film by wet etching using buffered oxide etchant (BOE) instead of reactive ion-beam etching However, these attempts are unsuccessful because the high reflection film does not reacts with the BOE.

SUMMARY OF THE INVENTION

The present invention provides a semiconductor laser diode in which a high reflection film can be totally removed from a bonding metal film formed on p-type and n-type electrodes.

The present invention also provides a method of manufacturing a semiconductor laser diode.

According to an aspect of the present invention, there is provided a semiconductor laser diode comprising an n-type compound semiconductor layer, a resonant layer stacked on a predetermined region of the n-type compound semiconductor layer, a p-type compound semiconductor layer formed on the resonant layer, electrodes formed on each of the p-type and n-type compound semiconductor layers, a bonding metal film stacked on the electrodes, and a high reflection film stacked on the other surface of the resonant layer facing a surface through which a laser generated from the resonant layer is emitted, wherein the thickness of the bonding metal film is greater than that of the high reflection film.

The high reflection film can be a single film or a double film sequentially stacked of a silicon oxide film and a titanium oxide film.

The high reflection film can be extended on the electrode around the bonding metal film.

The bonding metal film can be a single film having a greater thermal expansion coefficient than the high reflection film or a double film that includes a material film having a high thermal expansion coefficient.

When the bonding metal film is a double film, the thickness of the upper film of the bonding metal film is greater than the high reflection film.

According to another aspect of the present invention, there is provided a method of manufacturing a semiconductor laser diode, comprising: sequentially forming an n-type compound semiconductor layer, a resonant layer, and a p-type compound semiconductor layer on a substrate; forming a bonding metal film on the electrodes; respectively forming electrodes on the n-type and p-type compound semiconductor layers; forming a high reflection film that covers the other surface of the resonant layer facing a surface through which a laser generated from the resonant layer is emitted, on the bonding metal film; and removing the high reflection film stacked on the bonding metal film by cooling the resultant product on which the high reflection film is formed.

The thickness of the bonding metal film may be greater than that of the high reflection film. Also, the bonding metal film may be formed of a material having a greater thermal expansion coefficient than the high reflection film. According to another aspect of the present invention, there is provided a method of manufacturing a semiconductor laser diode, comprising: sequentially forming an n-type compound semiconductor layer, a resonant layer, and a p-type compound semiconductor layer on a substrate; respectively forming electrodes on the n-type and p-type compound semiconductor layers; forming a bonding metal film on the electrodes; depositing a material film having a weak adhesive force on the bonding metal film; forming a high reflection film that covers the other surface of the resonant layer facing a surface through which a laser generated from the resonant layer is emitted, on the bonding metal film; and removing the high reflection film stacked on the bonding metal film by cooling the resultant product on which the high reflection film is formed, wherein the material film may be a polymer film.

The bonding metal film may be a noble metal film or a double film that includes a noble metal film.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The above and other features and advantages of the present invention will become more apparent by describing in detail embodiments thereof with reference to the attached drawings in which.

DETAILED DESCRIPTION OF THE INVENTION

Figure 1:
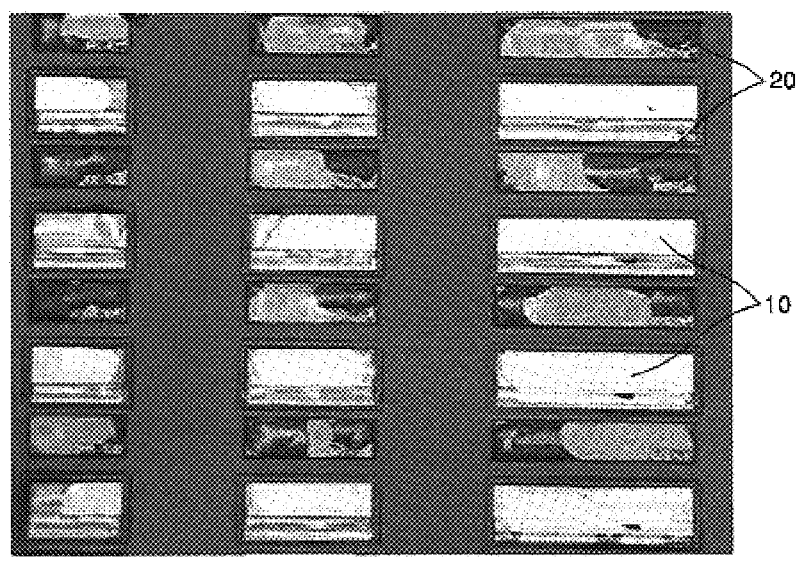
FIG. 1 is a plan view showing a problem occurring after forming a high reflection film on a bonding metal in a conventional method of manufacturing a semiconductor laser diode.

Hereinafter, embodiments of the present invention will now be described more fully with reference to the accompanying drawings. In the drawings, the thickness of layers and regions are exaggerated for clarity.

A semiconductor laser diode (hereinafter, a laser diode) according to the present invention will now be described.

Figure 2:
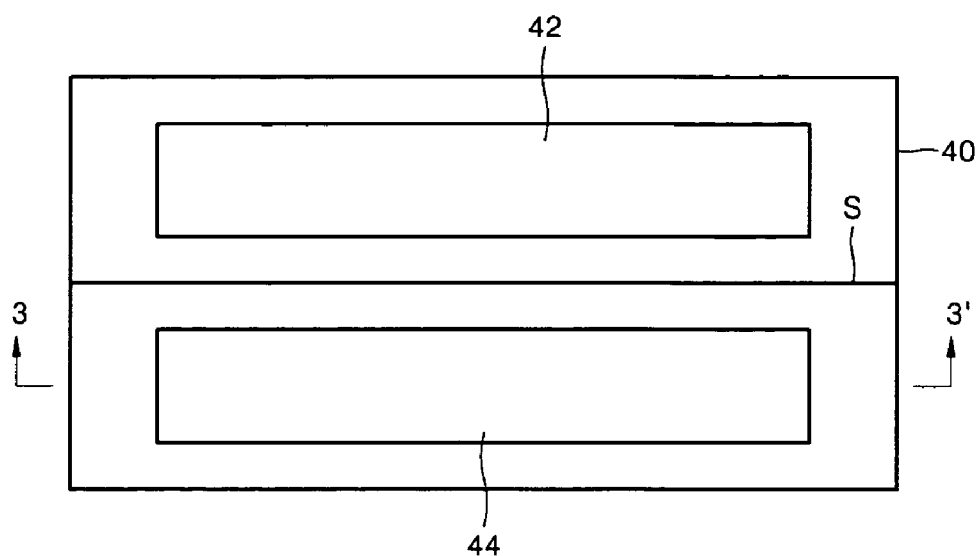
FIG. 2 is a plan view of a semiconductor laser diode according to an embodiment of the present invention.

FIG. 2 shows a plan view of a laser diode separated from a wafer after a high reflection film is removed. In FIG. 2, reference numeral 40 represents the laser diode of the present embodiment, reference numeral 42 represents a first bonding metal film formed on an n-type electrode (not shown), and reference numeral 44 represents a second bonding metal film formed on a p-type electrode (not shown). Reference symbol S indicates a step difference between a region where the first bonding metal film 42 is stacked and a region where the second bonding metal film 44 is stacked. Though it is not shown in the drawing, the region where the second bonding metal film 44 is stacked protrudes upward.

Figure 3:
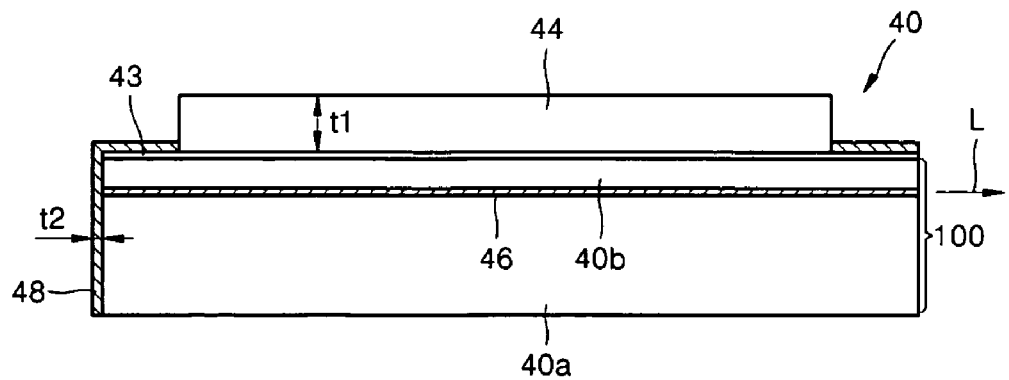
FIG. 3 is a cross-sectional view taken along line 3–3' in FIG. 2.

Referring to FIG. 3, which shows a cross-sectional view taken line 3–3' in FIG. 2, a resonant layer 46 that generates a laser beam includes an active layer and a clad layer. Reference symbol L indicates the laser beam emitted from the resonant layer 46. On and under the resonant layer 46, a p-type compound semiconductor layer 40b and an n-type compound semiconductor layer 40a are formed, respectively. An upper part of the p-type compound semiconductor layer 40b can have a ridge shape, but it is shown as being flat for convenience. The n-type compound semiconductor layer 40a may include a buffer layer, but it is shown as a single layer for convenience. The p-type electrode 43 is formed on the p-type compound semiconductor layer 40b, and the second bonding metal film 44 is stacked on a predetermined region of the p-type electrode 43. The p-type electrode 43 around the second bonding metal film 44 is covered by a high reflection film 48. The high reflection film 48 covers a left side of a stack 100 that includes the n-type compound semiconductor layer 40a, the resonant layer 46, and the p-type compound semiconductor layer 40b. Accordingly, the reflectance of the left side of the stack 100 is higher than that of a right side thereof. Therefore, a laser L generated from the resonant layer 46 is emitted from the right side of the stack 100 which is not covered by the high reflection film 48.

The second bonding metal film 44 is stacked to a first thickness t1, and the high reflection film 48 is stacked to a second thickness t2 which is thinner than that of the first thickness t1. It is preferable that the first thickness t1 be more than two times greater than the thickness of the second thickness t2, and more preferably, 1.5 times greater than the second thickness t2.

Also, it is preferable that the second bonding metal film 44 have a greater thermal expansion coefficient than that of the high reflection film 48. For example, if the high reflection film 48 is an oxide film sequentially stacked of a silicon oxide (SiO2) film and a titanium oxide (TiO2) film, the high reflection film 48 stacked in a manufacturing process on the second bonding metal film 44 must be completely removed, and since the silicon oxide film contacts the second bonding metal film 44, the second bonding metal film 44 is preferably formed of a noble metal film having a greater thermal expansion coefficient than the thermal expansion coefficient $(0.55 \times 10^{-6}/K)$ of the silicon oxide film. Therefore, the second bonding metal film 44 can be formed of gold, silver, or platinum. Each of the thermal expansion coefficients of the gold film, the silver film, and the platinum film is $14.2 \times 10^{-6}/K$, $19.7 \times 10^{-6}/K$. and $8.9 \times 10^{-6}/K$, respectively, and those are much greater than that of the silicon oxide film.

The same thing can be applied to the first bonding metal film 42 stacked on the n-type electrode.

On the other hand, the first and second bonding metal films 42 and 44 are depicted as a single film, but each of them can be a double film composed of an upper film and a lower film. In this case, the high reflection film 48 and the upper film are in the relationship with regard to thickness and thermal expansion coefficient as the second bonding metal film and the high reflection film 48.

Next, a method of manufacturing the semiconductor laser diode according to the present invention above will now be described with reference to FIGS. 4 though 7.

FIRST EMBODIMENT

This method is based on the thermal expansion coefficient difference between the high reflection film 48 and the first and second bonding metal films 42 and 44.

Figure 4:
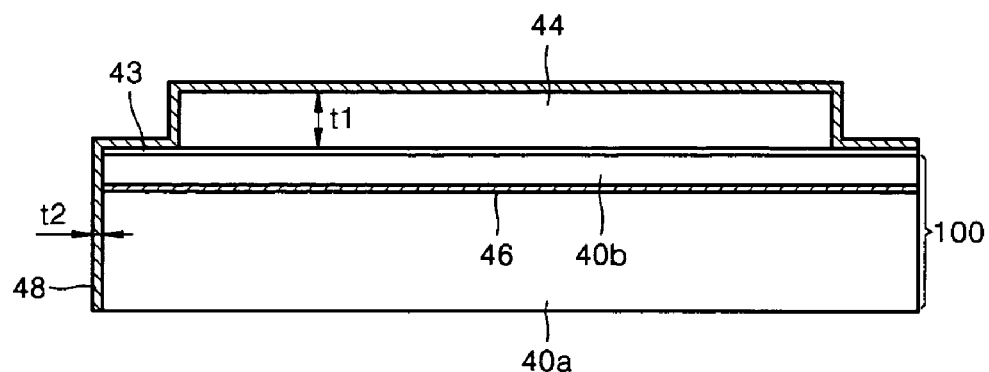
FIGS. 4 and 5 are cross-sectional views illustrating a method of manufacturing a semiconductor laser diode according to a first embodiment of the present invention.

Referring to FIG. 4, more specifically, an n-type compound semiconductor layer 40a that includes a buffer layer, a resonant layer 46 that generates a laser beam, and a p-type compound semiconductor layer 40b are sequentially formed on a substrate (not shown). In this process, an upper part of the p-type compound semiconductor layer 40b can be formed to have a ridge shape. A p-type electrode 43 is formed on the p-type compound semiconductor layer 40b. An n-type electrode (not shown) is formed at the same time. A second bonding metal film 44 with a first thickness t1 is formed on the p-type electrode 43. A first bonding metal film 42 (not shown) with the same thickness t1 is formed on the n-type electrode. The first and second bonding films 42 and 44 can be formed of a noble metal such as Au, Ag, or Pt having greater thermal expansion coefficient but lower reactivity and bonding force than the silicon oxide film that will be used as the high reflection film 48 in a subsequent process. After forming the first and second bonding films 42 and 44 on a side of a stack 100 that includes an n-type compound semiconductor layer 40a, a resonant layer 46, a p-type compound semiconductor layer 40b, a high reflection film 48 that covers an exposed portion of the p-type electrode 43, and the front surface and the left side of the first and second bonding films 42 and 44 are formed. The high reflection film 48 is formed using a sputtering apparatus. Preferably, the high reflection film 48 is formed of a dielectric film having a lower thermal expansion coefficient than that of the first and second bonding films 42 and 44, and formed to a first thickness t1 thinner than the second thickness t2. For example, the high reflection film 48 can be formed by sequentially stacking a silicon oxide film and a titanium oxide film having a much lower thermal expansion coefficient than that of a noble metal. At this time, the thickness of the first and second bonding films 42 and 44 is preferably greater than the thickness of the high reflection film 48, and more preferably, the first thickness t1 is 1.5 times greater than the second thickness t2.

On the other hand, each of the first and second bonding films 42 and 44 can be formed as a double film composed of upper and lower films. In this case, the upper film can be a noble metal film, and the lower film can be formed of a metal such as Cr. Since the upper film contacts the high reflection film 48, the upper film can be formed to a first thickness t1.

Figure 5:
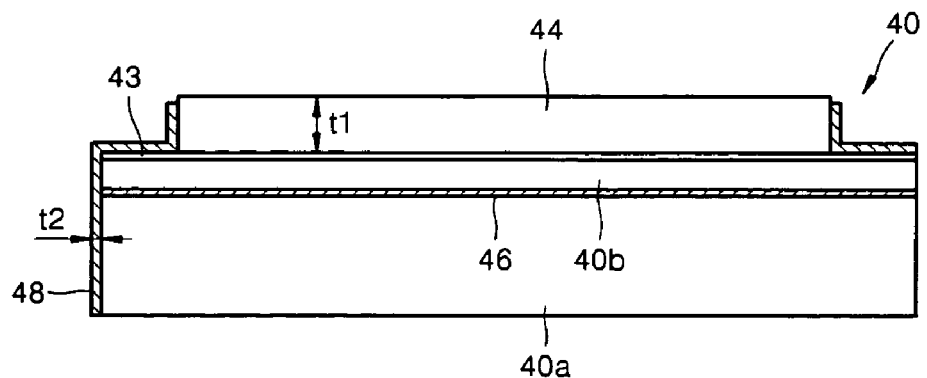

As described above, in the process for forming the high reflection film 48, a temperature of a wafer is increased to 150° C., and after forming the high reflection film 48, the temperature is reduced. Since the reactivity and bonding force between the first and second bonding films 42 and 44 and the high reflection film 48 are low and the thermal expansion coefficient difference is large, the first and second bonding films 42 and 44 and the high reflection film 48 are separated totally. FIG. 5 illustrates this result.

The method of manufacturing the semiconductor laser diode according to the present invention can totally remove the high reflection film 48 from the surface of the first and second bonding films 42 and 44 without using the conventional reactive ion etching.

SECOND EMBODIMENT

This embodiment presents a case of removing a high reflection film from a bonding metal film using a lift-off method. The description of the elements described in the first embodiment will be omitted. The following description is valid for the first bonding metal film 42.

Figure 6:
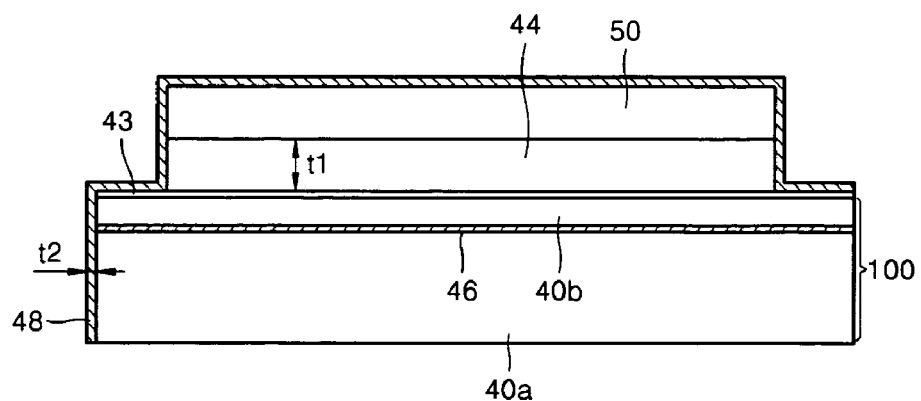
FIGS. 6 and 7 are cross-sectional views illustrating a method of manufacturing a semiconductor laser diode according to a second embodiment of the present invention.
Figure 7:
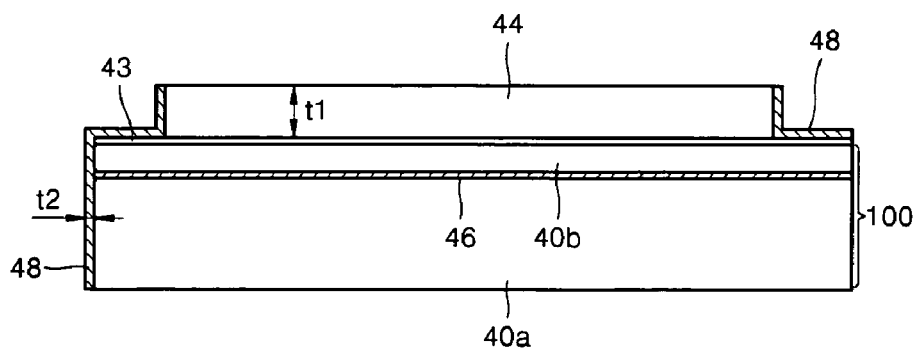

Referring to FIG. 6, a process for forming the second bonding film 44 is performed according to the first embodiment. A polymer film 50 such as a photo sensitive film having very low surface energy is formed on the second bonding film 44.

The reason why a polymer film 50 is formed on the second bonding film 44 is because the adhesive force of materials decreases in the following order.

metal>solid-solution>metal-oxide>metal-polymer

Since the adhesive force between the second bonding metal film 44 and the polymer film 50 is the lowest, the polymer film 50 can be easily removed from the second bonding metal film 44 after forming the high reflection film 48.

After forming the polymer film 50, the high reflection film 48 that covers the left surface of the stack 100 and the p-type electrode 43 are formed on the polymer film 50. After forming the high reflection film 48, the polymer film 50 is removed. At this time, the high reflection film 48 stacked on the polymer film 50 is also removed. In this manner, no portion of the high reflection film 48 remains on the second bonding metal film 44, which has a totally clean surface.

Figure 8:
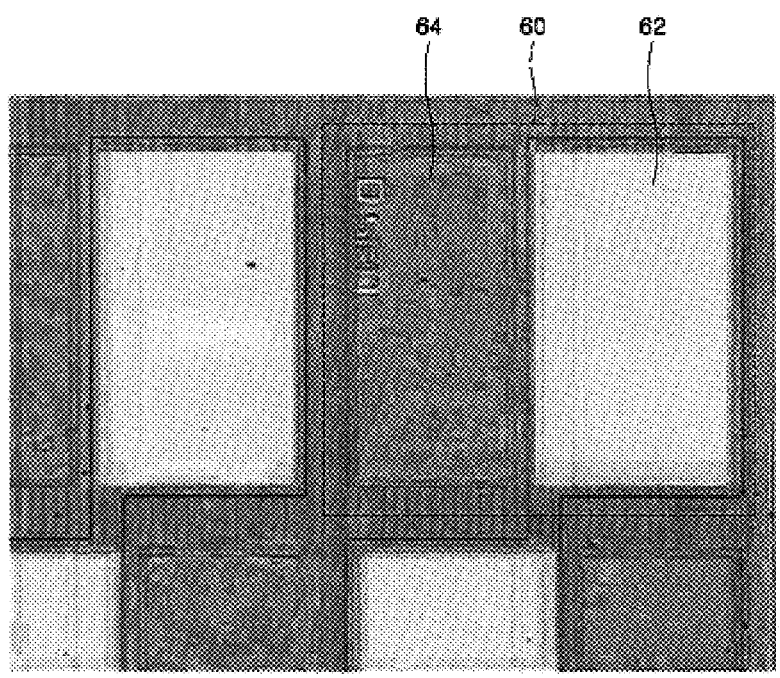
FIG. 8 is a plan view of a semiconductor laser diode after forming a high reflection film and completing a treatment process of the semiconductor laser diode according to first and second embodiments of the present invention.

FIG. 8 is a plan view of a semiconductor laser diode on which the high reflection film 48 is removed from the bonding metal film according to the method described above. Reference numeral 60 represents a semiconductor laser diode, reference numeral 62 represents a bonding metal film corresponding to the second bonding metal film 44 and formed on the p-type electrode 43, and reference numeral 64 represents a bonding metal film corresponding to the first bonding metal film 42.

The bonding metal films 62 and 64 depicted in FIG. 8 have clean surfaces unlike a surface of the bonding metal film 10 shown in FIG. 1.

As described above, when using the method of manufacturing a semiconductor laser diode according to the present invention, the high reflection film 48 can be completely removed from the bonding metal film, but from time to time, a small amount of the high reflection film 48 may remain on the bonding metal film. In this case, the remained amount of the high reflection film 48 can be removed using an attachable and detachable adhesive.

In the case of a semiconductor laser diode according to the present invention, the bonding metal film has a greater thickness than that of the high reflection film, and is formed of a noble metal having higher thermal expansion coefficient than the high reflection film. The bonding metal film is protected by a polymer film while forming a high reflection film. Also, since the high reflection film can be completely removed from the bonding metal film, heat generated from the semiconductor laser diode during operation can be effectively dissipated. Also, during bonding process for the semiconductor laser diode, weak bonding or non-bonding can be prevented.

While the present invention has been particularly shown and described with reference to embodiments thereof, it should not be construed as being limited to the embodiments set forth herein. For example, one skilled in this art could apply the technique of forming the high reflection film and the bonding metal film with different materials that may change a ratio of thickness between the bonding metal film and the high reflection film. Therefore, the scope of the present invention shall be defined by the technical spirit of the appended claims set forth herein.

What is claimed is:

1. A semiconductor laser diode comprising:
    an n-type compound semiconductor layer;
    a resonant layer stacked on a predetermined region of the n-type compound semiconductor layer;
    a p-type compound semiconductor layer formed on the resonant layer;
    electrodes respectively formed on each of the p-type and n-type compound semiconductor layers;
    a bonding metal film stacked on the electrodes; and
    a high reflection film stacked on an outer surface of the resonant layer facing a surface through which a laser generated from the resonant layer is emitted, wherein the high reflection film is extended on the electrodes around the bonding metal films, and wherein the thickness of the bonding metal film is greater than that of the high reflection film.

2. The semiconductor laser diode of claim 1, wherein the bonding metal film is a noble metal film.

3. The semiconductor laser diode of claim 1, wherein the high reflection film is one of a single film and a double film.

4. The semiconductor laser diode of claim 3, wherein the high reflection film is a double film sequentially stacked of a silicon oxide film and a titanium oxide film.

5. The semiconductor laser diode of claim 1, wherein the bonding metal film is one of a single film having a greater thermal expansion coefficient than the high reflection film and a double film that includes a material film having a high thermal expansion coefficient.

6. The semiconductor laser diode of claim 5, wherein, when the bonding metal film is a double film, the thickness of the upper film of the bonding metal film is greater than the high reflection film.

7. The semiconductor laser diode of claim 6, wherein the upper film is a noble metal film.

8. A method of manufacturing a semiconductor laser diode, comprising:
   sequentially forming an n-type compound semiconductor layer, a resonant layer, and a p-type compound semiconductor layer on a substrate;
   respectively forming electrodes on the n-type and p-type compound semiconductor layers;
   forming a bonding metal film on the electrodes;
   forming a high reflection film that covers the other surface of the resonant layer facing a surface through which a laser generated from the resonant layer is emitted, on the bonding metal film; and
   removing the high reflection film stacked on the bonding metal film by cooling the resultant product on which the high reflection film is formed.

9. The method of claim 8, wherein, after removing the high reflection film from the bonding metal film, an adhesive film is attached to the bonding metal film and detached from the bonding metal film.

10. The method of claim 8, wherein the bonding metal film is formed with a double film, and the thickness of the upper film of the bonding metal film is greater than that of the high reflection film.

11. The method of claim 8, wherein the thickness of the bonding metal film is greater than the high reflection film.

12. The method of claim 11, wherein the bonding metal film is formed of a material having a greater thermal expansion coefficient than the high reflection film.

13. The method of claim 12, wherein the bonding metal film is a noble metal film, and the high reflection film is a dielectric film.

* * * * *